United States Patent [19]

Shaw et al.

[11] 4,293,629

[45] Oct. 6, 1981

[54] ELECTROSTATIC MASTER AND METHOD FOR MAKING THE SAME

[75] Inventors: Michael J. Shaw, Paw Paw; Robert J. Thiessen, Richland, both of Mich.

[73] Assignee: Allied Paper Incorporated, Kalamazoo, Mich.

[21] Appl. No.: 84,409

[22] Filed: Oct. 12, 1979

Related U.S. Application Data

[60] Continuation-in-part of Ser. No. 930,329, Aug. 2, 1978, abandoned, which is a division of Ser. No. 827,127, Aug. 24, 1977, abandoned.

[51] Int. Cl.[3] .......................... G03F 7/02; B41M 5/00; B41N 1/00

[52] U.S. Cl. ...................................... 430/64; 101/453; 101/463.1; 162/135; 162/136; 162/138; 162/168 R; 162/184; 427/336; 427/364; 427/366; 428/327; 428/336; 428/342; 430/18; 430/14; 430/65; 430/930; 430/961

[58] Field of Search ............... 101/453, 457, 462, 463; 162/138, 168 R, 184, 136, 135; 430/18, 64, 14, 65, 930, 961; 428/327, 336, 342, 514, 530; 427/336, 364, 366, 391, 393.4, 411, 428

[56] References Cited

U.S. PATENT DOCUMENTS

| | | | |
|---|---|---|---|
| 2,764,085 | 9/1956 | Shoemaker et al. | 101/149.2 |
| 3,083,637 | 4/1963 | Thurlow | 101/149.2 |
| 3,281,267 | 10/1966 | Rice | 162/138 X |
| 3,298,831 | 1/1967 | Lau et al. | 430/14 |
| 3,653,894 | 4/1972 | Levy et al. | 162/138 X |
| 3,779,800 | 12/1973 | Heiser | 260/29.6 WA X |
| 3,787,235 | 1/1974 | Honjo et al. | 162/138 X |
| 3,839,033 | 10/1974 | Matsuno et al. | 162/138 X |
| 3,968,319 | 7/1976 | Mani et al. | 428/511 |

FOREIGN PATENT DOCUMENTS

D. 594688 3/1960 Canada .

*Primary Examiner*—Ronald H. Smith
*Assistant Examiner*—Thurman K. Page
*Attorney, Agent, or Firm*—Richard H. Thomas; Merton H. Douthitt

[57] ABSTRACT

The present invention resides broadly in a method for the preparation of paper having improved water and/or solvent resistance which comprises applying to a base paper a plastic particle containing formulation, and then wetting the formed coating with a solvent to which the plastic particles are sensitive. The present invention is particularly applicable to the preparation of electrostatic paper masters of improved water resistance for lithographic printing having a photoconductive layer and a barrier coat to which the photoconductive layer is applied. The barrier coat contains a binding amount of a binder resin and filler at least a portion of which is an amount of said plastic particles sensitive to the solvent system of the photoconductive layer, the amount of plastic particles and sensitivity being sufficient to materially increase water resistance.

21 Claims, No Drawings

ELECTROSTATIC MASTER AND METHOD FOR MAKING THE SAME

The present application is a continuation-in-part of prior application Ser. No. 930,329, (now abandoned) filed Aug. 2, 1978, which in turn is a division of prior application Ser. No. 827,127, (now abandoned) filed Aug. 24, 1977, and assigned to assignee of the present application.

The present invention relates broadly to the preparation of water and/or solvent resistant paper. The invention has particular application in the preparation of electrostatic paper masters, for lithographic printing, wherein an image is obtained employing a photoconductive material. It will be described particularly with reference to electrostatic paper masters wherein the photoconductive layer is zinc oxide in a dielectric resin binder, although it will be apparent to those skilled in the art that the invention, in this respect, is also applicable to other lithographic paper masters, such as those wherein the photoconductive material is polyvinyl carbazole, cadmium sulfide, a selenium compound, or a mixture thereof. The present invention also has application in the preparation of water resistant papers such as wrapping paper, food paper, printing paper, label paper, diazo paper; papers which require solvent resistance, such as Electrofax copy base paper, dielectric base paper, stamp paper and solvent based silicone release paper; and direct image lithographic masters wherein the image is obtained other than by photoconductivity.

BACKGROUND OF THE INVENTION

A conventional photoconductive electrostatic master comprises a sheet of electrically conductive paper having a surface coated with a layer of finely divided zinc oxide in a dielectric resin binder. This is called the photoconductive layer and is usually applied from a solvent such as toluene. The zinc oxide is non-conductive in the dark, and this property, plus the dielectric property of the resin binder, renders the conductive layer capable of receiving a uniform electrostatic charge and retaining it for an appreciable period of time in darkness. However, when the zinc oxide is subsequently exposed to light, around an image, the zinc oxide becomes conductive and the electrostatic charge in the non-imaged areas is discharged through the paper. The remaining charged area, that corresponds to the original image, is then made visible by contacting the surface carrying the electrostatic charged pattern with finely divided developer material, referred to as toner, bearing a charge opposite to that of the electrostatic image. The developer material deposits on the plate in the image configuration and is fused to the plate surface by heat. Alternative methods of fusing involve liquid toner or pressure fusing technology. The electrostatic master is then treated with an aqueous etch solution which renders the non-imaged areas hydrophilic. The toner used in the imaged area is hydrophobic and oleophilic.

In use in printing, the electrostatic masters are wet with an aqueous fountain solution which functions to wet the hydrophilic non-imaged areas exclusive of the oleophilic imaged area. When the plate is contacted with an ink roll, coated with an oil based printing ink, the ink is repelled by the hydrophilic surface in the non-imaged areas and deposits only on the oleophilic imaged area of the plate. The ink then may be transferred to a paper sheet to provide the final product.

The plate will also function when the oil and water are applied simultaneously.

In practice, the fountain solution and ink are applied to the master once for each printed sheet produced. In long run masters, it is necessary to protect the paper base, which preferably is a wet strength paper, against the action of the aqueous fountain solution. This protection is usually achieved by providing the paper base with one or more water resistant layers, which can be referred to as barrier coatings, between the base and the photoconductive layer.

Absorption of the fountain solution into the paper base has several undesirable effects. Primarily, it causes a dimensional expansion of fibers in the paper in turn causing distortion of the paper and image resulting in imperfect registration and wrinkling of the plate. Attack by water on the zinc oxide or photoconductive layer bond as well as on various sub-coatings reduces the strength of these bonds. Eventually picking of portions of the zinc oxide coating and/or sub-coatings off the master onto the printing blanket causes loss of image continuity and/or background fill in.

Conventional barrier coatings, used in the construction of lithographic paper masters, are described in U.S. Pat. Nos. 3,298,831, issued to Lau; 3,653,894, issued to Levy; 3,839,033, issued to Matsuno; and 3,787,235, issued to Honjo. The use of natural and synthetic adhesives to provide surface strength and water resistance to lithographic masters are summarized in TAPPI monographs numbers 36 and 37, by the Technical Association of the Pulp and Paper Industry (TAPPI), One Dunwoody Park, Atlanta, Ga. 30341.

SUMMARY OF THE INVENTION

The present invention resides broadly in the discovery that an improved water resistant or solvent resistant paper barrier coat, containing a binding amount of a resinous binder, can be obtained by including in the coating formulation an amount of plastic particles. Following application, the barrier coat is subjected to drying, and then wetting with a solvent to which the plastic particles are sensitive, the amount of plastic particles and their sensitivity being that necessary to achieve an effective increase in water and/or solvent resistance.

A preferred form of the present invention resides in the preparation of electrostatic paper masters wherein the plastic particles of the barrier coat are sensitive to the solvent system of the photoconductive layer of the master. Thus application of the photoconductive layer results in materially increased water resistance of the master.

Although the present invention is not limited to any particular theory as to the reason for its effectiveness, it is believed that the plastic particles are swollen, or partially or totally dissolved in the solvent system for the photoconductive layer such that when the solvent used is evaporated, a semi- or totally continuous plastic film is formed.

The type of plastic particle is not critical, so long as it is impervious to water and/or solvents but sensitive to the solvent system employed in the wetting of the barrier coat or application of the photoconductive layer. In the case of electrostatic paper masters bearing zinc oxide containing coatings, the zinc oxide is normally applied from about a 50% dispersion in a solvent such as toluene. The plastic particles thus should be sensitive to toluene or the solvent used. Other solvents typically employed are aromatic compounds such as benzene, xylene, chlorinated aliphatic compounds such as methylene chloride, and ketones such as acetone and methylethyl ketone.

The discrete plastic particles of the present invention comprise any non-film forming organic polymer which is water-insoluble and is insoluble in the particular binder used in the barrier coating formulation. By "non-film forming", it is meant that the dispersed plastic particles do not coalesce to form a film at ambient temperature and at temperatures and pressures selected to dry or finish the coated paper. Preferred polymers, however, are thermoplastic organic polymers. Especially preferred polymers are also classified as resinous and are substantially colorless, although this is dependent in part on the particular application involved.

A large number of prior patents have been granted on the use of plastic particles in paper coating formulations. Representative are U.S. Pat. Nos. 3,968,319; 3,949,138; 3,779,800; 3,996,056; and 3,281,267. With regard to the types of plastic particles employed, the disclosures of these prior patents are incorporated by reference herein. Insofar as is known, no patents have issued disclosing the use of plastic particles in a paper coating formulation, for instance for lithographic masters, to obtain improved water or solvent resistance.

Examples of suitable materials which may be employed in the preparation of the plastic particles, sensitive to the above-mentioned solvents, to effect water or solvent resistance, include polystyrene, polyvinyl acetate and copolymers thereof, polyvinyl butyral and copolymers thereof, polyacrylates and copolymers thereof, and mixtures of any of the above. Not included are plastic materials which are inherently water attractive or water sensitive under conditions where a lithographic master is normally used.

Suitable binders for the plastic pigment particles include natural binders such as starch, modified starch, casein, and soybean protein; or modified starch binders such as oxidized, enzyme converted, or hydroxyethylated starch. Suitable synthetic binders include the styrene-butadiene latexes; the acrylic resin emulsions, especially such aqueous dispersions of polymers which include a small amount of copolymerized ethylenically unsaturated carboxylic acid; the latexes of copolymers of butadiene and acrylonitrile, vinyl acetate and the acrylates, butadiene and methyl methacrylate, vinyl chloride and vinylidene chloride, and the like; and homopolymers of butadiene, methyl methacrylate, vinyl acetate, chloroprene, vinyl chloride, butyl methacrylate, and the like; as well as polymeric materials which are at least partially soluble in an aqueous media such as polyvinyl alcohol, partially hydrolyzed polyvinyl acetate, and totally or partially hydrolyzed polymers of styrene and maleic anhydride.

In addition to plastic particles, the barrier layer can contain other pigment materials, for instance clay, silica, calcium carbonate and alumina, which may be added to the plastic particle formulation to provide properties such as smoothness to the coated paper. Also, materials such as conductive carbon, anionic and cationic conductive polymers, montmorillonite clays, hydrated alumina, colloidal alumina and silica, salts and polyhydric compounds may be added to the plastic particle formulation to obtain improved conductivity in the barrier coating.

The nascent barrier coating of the present invention may be applied with equipment well known in the art of coating. Examples of such equipment are a size press, a roll coater, a blade coater, an air knife coater and a rod coater.

The amount of plastic particles employed in the barrier coating formulation, and the size of the plastic particles, may be varied over wide ranges. Preferably, the plastic particle content comprises between about 10% and about 100% by weight of the total filler weight in the formulation. With regard to plastic particle sizes, somewhat better results have been obtained with particles of smaller size. A preferred range for average particle size is between about 0.01 and about 20.0 microns.

The amount of binder employed preferably is between about 10% and about 40% based on the total dry weight of pigment plus plastic particles. Other materials employed in the barrier coatings, such as conductive agents, should be chosen such as to avoid interference with the water and/or solvent resistance developed by the plastic particles, and should be used in amounts peculiar to the photographic speed of the master being prepared.

The present invention also resides broadly in a novel method for imparting increased water and/or solvent resistance to a paper base comprising applying to the paper base a coating formulation containing a binding amount of a resin binder and an amount of plastic particles; forming a continuous film on said paper base with said formulation; and treating said film with a solvent; the plastic particles being present in an amount and having sufficient sensitivity to said solvent to materially increase the water and/or solvent resistance. Examples of water resistant papers which may be prepared by the present invention are wrapping paper, food paper, printing papers and label papers. Examples of solvent resistant papers which may be prepared by the present invention are Electrofax copy base paper, dielectric base paper, stamp paper and solvent based silicone release paper.

A distinction should be made between "water resistant" paper and "water repellent" paper, wherein water initially beads up on the surface but then soaks into the sheet. The former are more in the nature of papers having a film barrier than the latter. However, water repellency is a desirable property of the plastic material of the present invention, as indicated above, as well as water resistance or insensitivity.

The present invention and advantages thereof will become more apparent from the following examples. By the term "materially increase", more than a token increase is meant. It will be evident from the following examples that the barrier coat can be applied in an amount such that it achieves approximately a 4 to 90-fold improvement (over untreated paper) in water resistance measured in terms of water absorption employing a standard test, such as a Cobb test described in Tappi Standards and Testing Methods T441M. In the following examples, it will become apparent that coat weight of the plastic particle containing coat of the present invention relates to the level of water resistance ultimately desired. A preferred range for the coat weight is about 0.5–15 lbs. per side per 3300 sq. ft. In this regard, the barrier coat of the present invention is on the functional side where water resistance is required. It may be desirable to also apply it to the back side, for example, to avoid curl. The above also applies in those cases where solvent resistance is desired.

Also, in the following examples, percentages are percentages by weight. The following is raw material data for certain ingredients used.

| | |
|---|---|
| Zinc Oxide | Photox 80, trademark, New Jersey Zinc Co. |
| Vinyl Acetate Acrylic Binder | E-041, trademark, Desoto Chemical Co. |
| Styrene Butadiene Latex | DL620, trademark, Dow Chemical Co. |
| Melamine Formaldehyde Cross-linking Resin | Parez 707, trademark, Cyanamid Corp. |
| Soybean Protein | Procote 200, trademark, Ralston Purina Corp. |
| Clay | No. 2 HT Coating Clay, trademark, Englehard Minerals & Chemicals Corp. |

EXAMPLE 1

A paper whose basis weight was 61 lb./3300 sq. ft. and contained a wet strength resin, was given to both sides a conventional barrier precoating of 7 lb./3300 sq. ft. per side. This coating consisted of, on a weight basis, about 80% clay, about 5% soybean protein and about 15% styrene-butadiene latex (including about 10% melamine formaldehyde cross-linking resin based on latex weight). The paper was dried, given a light calendering between two steel rolls, and then was coated in a series of runs with the formula described above containing varying amounts of polystyrene plastic particles in place of equivalent amounts of the clay. In the various runs, different brands of polystyrene plastic particles having different average particle sizes were used, as follows:

| | | Average Particle Size Microns |
|---|---|---|
| Monsanto Chemical Co. | 1975 Plastic Pigment | 0.03 |
| Dow Chemical Co. | 788 Plastic Pigment | 0.12 |
| Dow Chemical Co. | 8656 Plastic Pigment | 0.20 |
| Dow Chemical Co. | 722 Plastic Pigment | 0.50 |

All of the plastic particle formulations had a solids content of about 45-50%. Also varied in the different runs was the coat weight of the plastic particle containing formulation applied. This coating was applied to the functional side only. After coating, the paper was dried and was again given a steel-to-steel light calendering. The Cobb test which consists of placing the sheet in contact with water for 2½ minutes, discarding the water, gently blotting excess water off the paper, and then determining the weight of water absorbed, was measured for each run. This procedure correlates with the amount of water actually absorbed on a printing press. The paper in each run was then coated with a 50% zinc oxide dispersion in toluene containing about 5% vinyl acetate-acrylic binder at a coat weight of 23.5 lb./3300 sq. ft., and was then dried. The Cobb test was again measured. These results for various plastic particles and clay combinations are summarized in Table I.

TABLE I

| Run | Average Plastic Particle Size - Microns | % Plastic Particles of Total Filler Material | % Clay of Total Filler Material | Plastic Particle Coat Weight lb./3300 sq.ft. | 2½ Minute Cobb Test Before ZnO Coating gm/m² | 2½ Minute Cobb Test After ZnO Coating gm/m² |
|---|---|---|---|---|---|---|
| 1 | — | 0 | 100 | 0 | 26.7 | 21.8 |
| 2 | 0.03 | 50 | 50 | 2.5 | 25.4 | 1.8 |
| 3 | 0.12 | 50 | 50 | 2.5 | 24.4 | 2.0 |
| 4 | 0.20 | 50 | 50 | 2.5 | 23.8 | 6.1 |
| 5 | 0.50 | 50 | 50 | 2.5 | 25.4 | 0.7 |
| 6 | 0.03 | 100 | 0 | 2.2 | 24.1 | 1.2 |
| 7 | 0.12 | 100 | 0 | 2.2 | 25.4 | 0.8 |
| 8 | 0.20 | 100 | 0 | 2.2 | 25.8 | 1.3 |
| 9 | 0.50 | 100 | 0 | 2.2 | 27.2 | 0.3 |

In the first run, Run No. 1, of Table I, the barrier coat contained 100% clay (of the filler content) and no plastic particles. Before application of the zinc oxide photoconductive layer, a conventional level of water resistance, as evidenced by the Cobb test, was noted, and very little improvement was obtained after application of the photoconductive layer.

By comparison, the second, third, fourth and fifth runs were carried out with barrier coatings containing equal amounts of clay and plastic particles. Dramatic improvements in water resistivity, as determined by the Cobb test, were obtained following application of the photoconductive layer. The use of plastic particles of different particle sizes seemed to have little effect on water resistance (column 2 gives the range of particle sizes employed).

In Runs 6 through 9, the plastic particles comprised 100% by weight of the filler material in the barrier coating. No clay was employed. Here also, dramatic improvements were noted in the water resistance as determined by the Cobb test. Again, little correlation was noted between the plastic particle sizes employed (column 2) and water resistance. Runs 6 through 9 were carried out with lower coat weights than Runs 2 through 5. Equivalent or better water resistance was obtained with lower coat weights when the pigment content was 100% plastic particles.

EXAMPLE 2

This example illustrates the effect of level of plastic particles in the barrier coat on the Cobb test. The formulation (about 15% styrene-butadiene binder on a weight basis) and procedures of Example 1 were employed, the plastic particles having an average size of 0.12 microns. As indicated in the following Table II, the filler content varied from 0% plastic particles to 100% plastic particles, the remainder being clay. The plastic particles employed were polystyrene (Dow 788 Plastic Pigment).

TABLE II

| % Plastic Particles | 2½ Minute Cobb Test |
|---|---|
| 0 | 21.2 |
| 40 | 6.1 |
| 60 | 2.8 |
| 70 | 2.4 |
| 80 | 1.8 |
| 90 | 1.6 |

TABLE II-continued

| % Plastic Particles | 2½ Minute Cobb Test |
|---|---|
| 100 | 1.3 |

From the results of Table II, it can be seen that significant improvements were achieved over a wide range of proportions of plastic particles in the barrier coating. Although the best results were obtained with high levels of plastic particles, the effective preferred range of the present invention comprises about 10% to about 100% based on filler weight.

EXAMPLE 3

This example illustrates application of the concepts of the present invention to the preparation of water resistant paper for all sorts of uses, such as wrapping paper, food paper, printing papers, label papers and the like.

In this example, comparative data was obtained employing varying amounts of plastic particles, binder and clay. Four different procedures were employed. The first procedure "1" involved coating a precoated sheet of paper with barrier coat formulae having varying amounts of plastic pigment, binder and clay, followed only by drying the coat. In the second procedure "2", the dried coat was subjected to calendering. In the third procedure "3", the dried coat was rod coated with toluene and then redried, and in the fourth procedure "4", the dried coat was both calendered and rod coated with toluene (in that sequence), followed by final drying.

Also in this example, the particle size of the plastic particles was varied over a wide range. The values given are the two and one-half minute Cobb tests.

Data obtained on the various runs is given in the following Tables III–VI. Table III gives results employing a plastic particle containing formulation in which the filler was 25% plastic particles and 75% clay. In the runs of Table IV, the filler content was 50% plastic particles and 50% clay. This was changed to 75% plastic particles in the runs of Table V and to 100% plastic particles in the runs of Table VI.

Specific data on the procedures employed is as follows:

The base paper employed (such as that of Example 1) was given a precoat to both sides of about 7 lb./3300 sq. ft. (per side) of a formula containing on a weight basis about 5% soybean protein, about 15% styrene-butadiene binder, and the remainder clay. The purpose of the precoat was to give a smooth, somewhat water resistant base in order to obtain maximum efficiency of the plastic particles. The plastic particle formulae were then applied, to one side only as in Example 1, all formulae containing about 15% styrene-butadiene binder. The plastic pigment formulae were then dried in about two minutes at 180° F. following coating. In procedures 3 and 4, the paper after toluene application was again dried for about one minute at 180° F. As a standard for the values of the following Tables III–VI, reference can be made to the Cobb test result of 25.5 of Example 1 with a sheet with 100% clay (and no plastic particles). This value was affected neither by calendering nor treatment with toluene.

In the tables, the terms "Type A" and "Type B" refer to plastic particle brands having different levels of toluene sensitivity, the brands identified as Type A having medium toluene sensitivity and those identified as Type B having high toluene sensitivity. In the following Table III, the total coat weight of the plastic particle formulation was 1.8 lb./3300 sq. ft. The plastic particle weight (weight of particles applied to the paper) was 0.45 lb./3300 sq. ft.

TABLE III

COBB TESTS WITH 25% PLASTIC PARTICLES USED IN THE FORMULA

| Plastic Particle Size Microns | Procedure 1 | Procedure 2 | Procedure 3 | Procedure 4 |
|---|---|---|---|---|
| 0.03[1] | 26.8 | 26.9 | 20.6 | 18.2 |
| 0.08[2] | 26.4 | 25.9 | 15.5 | 14.5 |
| 0.12[3] | 27.4 | 25.5 | 12.5 | 10.6 |
| 0.17[4] | 27.7 | 27.2 | 18.8 | 18.1 |
| 0.20[5] Type A | 23.8 | 26.3 | 14.3 | 12.8 |
| 0.20[6] Type B | 26.6 | 26.4 | 15.5 | 14.1 |
| 0.25[7] | 25.5 | 24.7 | 11.1 | 10.4 |
| 0.50[8] Type A | 32.1 | 26.8 | 18.3 | 16.3 |
| 0.50[9] Type B | 28.2 | 27.3 | 20.6 | 17.8 |

[1]1975 plastic pigment, trademark, Monsanto Chemical Company.
[2]RX 1265 plastic pigment, trademark, Monsanto Chemical Company.
[3]788 plastic pigment, trademark, Dow Chemical Company.
[4]XD8638, trademark, Dow Chemical Company.
[5]RX1672, trademark, Monsanto Chemical Company.
[6]8656 plastic pigment, trademark, Dow Chemical Company.
[7]RX1928, trademark, Monsanto Chemical Company.
[8]722 plastic pigment, trademark, Dow Chemical Company.
[9]RX 1259, trademark, Monsanto Chemical Company.

TABLE IV

COBB TESTS WITH 50% PLASTIC PARTICLES USED IN THE FORMULA

| Plastic Particle Size Microns | Procedure 1 | Procedure 2 | Procedure 3 | Procedure 4 |
|---|---|---|---|---|
| 0.03 | 26.7 | 26.7 | 16.6 | 14.2 |
| 0.08 | 27.4 | 25.9 | 6.8 | 6.7 |
| 0.12 | 25.9 | 25.2 | 6.2 | 5.1 |
| 0.17 | 28.6 | 27.9 | 12.7 | 10.6 |
| 0.20 Type A | 27.8 | 25.7 | 10.4 | 8.0 |
| 0.20 Type B | 14.5 | 12.8 | 6.7 | 6.0 |
| 0.25 | 25.7 | 25.4 | 7.3 | 5.8 |
| 0.50 Type A | 29.1 | 27.9 | 11.5 | 10.7 |
| 0.50 Type B | 27.8 | 25.7 | 10.4 | 8.0 |

The total coat weight of the plastic particle formulation was 1.5 lb./3300 sq. ft. The coat weight of plastic particles was 0.75 lb./3300 sq. ft.

TABLE V

COBB TESTS WITH 75% PLASTIC PARTICLES USED IN THE FORMULA

| Plastic Particle Size Microns | Procedure 1 | Procedure 2 | Procedure 3 | Procedure 4 |
|---|---|---|---|---|
| 0.03 | 26.0 | 27.3 | 16.1 | 14.1 |
| 0.08 | 25.2 | 25.2 | 5.0 | 4.7 |
| 0.12 | 25.6 | 26.4 | 6.2 | 3.0 |
| 0.17 | 28.0 | 27.0 | 10.3 | 8.2 |
| 0.20 Type A | 26.2 | 28.3 | 8.7 | 4.6 |
| 0.20 Type B | 17.9 | 18.1 | 6.2 | 6.5 |
| 0.25 | 26.3 | 26.0 | 4.9 | 4.9 |
| 0.50 | 27.9 | 28.0 | 11.9 | 10.1 |

TABLE V-continued

| COBB TESTS WITH 75% PLASTIC PARTICLES USED IN THE FORMULA | | | | |
|---|---|---|---|---|
| Plastic Particle Size Microns | Procedure 1 | Procedure 2 | Procedure 3 | Procedure 4 |
| Type A | | | | |
| 0.50 | 26.3 | 26.3 | 8.1 | 9.1 |
| Type B | | | | |

The total coat weight of plastic particle formulation was 1.30 lb./3300 sq. ft. The coat weight of plastic particles was 0.98 lb./3300 sq. ft.

TABLE VI

| COBB TESTS WITH 100% PLASTIC PARTICLES USED IN THE FORMULA | | | | |
|---|---|---|---|---|
| Plastic Particle Size Microns | Procedure 1 | Procedure 2 | Procedure 3 | Procedure 4 |
| 0.03 | 27.4 | 26.4 | 13.2 | 10.9 |
| 0.08 | 24.0 | 24.1 | 4.7 | 3.2 |
| 0.12 | 25.3 | 25.4 | 5.4 | 1.8 |
| 0.17 | 27.6 | 27.6 | 12.5 | 13.5 |
| 0.20 | 25.3 | 25.8 | 5.2 | 4.1 |
| Type A | | | | |
| 0.20 | 17.5 | 17.5 | 2.4 | 2.4 |
| Type B | | | | |
| 0.25 | 26.2 | 25.4 | 3.0 | 3.2 |
| 0.50 | 29.0 | 27.2 | 6.1 | 6.5 |
| Type A | | | | |
| 0.50 | 27.3 | 24.7 | 4.9 | 5.3 |
| Type B | | | | |

A plastic particle coat weight of 1.2 lb./3300 sq. ft. was used. No clay was used.

It is evident from the data of Tables III through VI that the use of calendering and the toluene wash improve the Cobb test, although the latter does more dramatically. The above data also shows that increasing amounts of plastic pigment give improved final Cobb test results (less water absorbed). Calendering after each coating operation also assists in provided water resistance. No rigorous conclusion on the effect of particle size can be drawn within the size range studied. Preferably the average particle size is between about 0.01 to 20.0 microns.

EXAMPLE 4

The effect of different types of binders at 20% based on the dry weight of the plastic particles and clay was studied. The ratio of plastic particles to clay was 1:1. These results are summarized in the following Table VII. Low levels of carboxylation give best final Cobb test results. Styrene-butadiene binders, by comparison with natural binders such as soybean protein, appear to develop better water resistance in the present system. An interaction may occur with the toluene, with both the plastic pigment and the binder. Thus, thermoplastic and solvent sensitive binders are preferred for optimum water resistance. The four procedures of Example 3 were employed, utilizing the same precoat and barrier coat formulae. The plastic particle brand employed was Dow 8656 polystyrene (20 microns average particle size).

TABLE VII

| EFFECT OF BINDER ON COBB TEST | | | | |
|---|---|---|---|---|
| Type of Binder | Procedure 1 | Procedure 2 | Procedure 3 | Procedure 4 |
| DL620* Styrene-butadiene, Medium carboxylation | 24.2 | 24.4 | 7.4 | 4.6 |
| DL630* Styrene-butadiene, Low carboxylation | 22.3 | 22.8 | 8.3 | 3.2 |
| DL650* Styrene-butadiene, High carboxylation | 23.4 | 24.4 | 11.1 | 10.0 |
| DL673* Styrene-butadiene, High carboxylation | 24.2 | 24.6 | 7.3 | 8.2 |
| DL8743* Styrene-butadiene, Medium carboxylation | 23.5 | 24.5 | 10.5 | 9.7 |
| Protein | 24.2 | 24.5 | 17.0 | 17.1 |
| Vinyl acetate | 23.1 | 23.5 | 10.4 | 8.9 |

*Trademark, Dow Chemical Company.

EXAMPLE 5

This example illustrates that a precoat is not necessary to obtain materially improved water resistance. A sheet having a basis weight of 61 pounds, and no precoat, was given to one side only a coating of 3 pounds/3300 sq. ft. The coating contained 50% plastic particles and 50% clay, plus styrene-butadiene binder at 20%, based on the weight of clay plus plastic particles. It can be seen from Table VIII that significantly improved Cobb test results were obtained, even though no precoat was employed. The specific procedure employed was that of Example 3, as was the formula.

TABLE VIII

| Plastic Particle Size Microns | Cobb Test No Toluene Applied | Cobb Test Toluene Applied |
|---|---|---|
| 0.50 | 25.4 | 3.6 |
| 0.12 | 24.4 | 3.7 |
| 0.20 | 23.8 | 8.1 |
| 0.08 | 25.4 | 4.4 |

To further illustrate this, a series of tests was carried out with the plastic particle containing formulation of Example 3, having no clay, applied to a 38-pound, uncoated paper at varying coat weights. Results using 100% plastic particles and about 15% styrene-butadiene binder are presented in the following Table IX, and results obtained with 50% plastic particles plus 50% clay using about 15% styrene-butadiene binder are given in the following Table X.

TABLE IX

| Particle Size Microns | Coat Weight lb./3300 sq. ft. | Cobb Test Before Toluene Treatment | Cobb Test After Toluene Treatment |
|---|---|---|---|
| 0.08 | 2.2 | 31.4 | 3.0 |
| 0.5 | 2.4 | 21.8 | 4.6 |
| 0.2 | 3.0 | 28.5 | 3.7 |
| 0.2 | 2.4 | 22.3 | 5.1 |

TABLE X

| Particle Size Microns | Coat Weight lb./3300 sq. ft. | Cobb Test Before Toluene Treatment gm/m² | Cobb Test After Toluene Treatment gm/m² |
|---|---|---|---|
| 0.08 | 2.6 | 31.9 | 8.4 |
| 0.50 | 3.2 | 37.8 | 5.9 |
| 0.20 | 2.8 | 33.9 | 4.8 |
| 0.20 | 2.8 | 29.9 | 5.2 |

In all instances, materially improved water resistance was obtained.

Tables VIII, IX and X illustrate the flexibility of the present invention, that is operability without a precoat, and effectiveness on lightweight as well as heavy-weight, non-precoated paper at different levels of plastic particles in the coat applied.

It was stated with regard to procedure 4 of Tables III-VII that the sequence employed was calendering and then rod coating. This is the preferred sequence, but the reverse sequence of rod coating with solvent and then calendering can also be employed.

An alternative to wetting with a solvent such as toluene, or an alternative means for wetting, comprises adding to the barrier coat formulation containing the plastic particles an amount of toluene or other plastic particle sensitive solvent which is suitably microencapsulated using well-known technology.

Calendering the coating, after application, with warm rolls applying sufficient pressure and/or heat to rupture the capsules, then achieves a water resistant barrier. An advantage is that this is accomplished in a single step rather than two.

A further alternative comprises using the teachings of prior U.S. Pat. No. 3,775,353 to Kohne, Jr., et al. In this patent, improved optical properties are obtained by mixing a polystyrene-containing aqueous dispersion, termed an emulsion in this patent, with a swelling agent which penetrates the polymer or copolymer particle causing it to swell, followed by setting the particle in its swollen state.

Using the same technology, it is possible to disperse or emulsify toluene or other plastic particle sensitive solvents in water with the aid of a wetting agent such as Triton X-100, trademark Union Carbide Corporation, or sodium lauryl sulfate. The emulsified toluene is then added to the coating formulation containing 10-100% plastic particles, based on the filler content, an amount of clay or other filler if the plastic particle content is less than 100% of the filler content, and a binder. The formulation is then applied to base paper, dried and optionally calendered. Following treatment with a solvent such as toluene, improved water resistance is obtained.

Another alternative is to apply the plastic particle containing formulation followed by a conventional water resistant coating permeable to the solvent. Final treatment with toluene or a solvent to which the plastic particles are sensitive yields water resistance.

EXAMPLE 6

Solvent resistance for such papers as Electrofax copy base paper, dielectric base paper, stamp paper and solvent based silicone release paper is obtained by employing the same procedures as given in Examples 1-5. For this application of the present invention, it is important to distinguish macroscopic and microscopic solvent resistance. Macroscopic holdout refers to the penetration of, for example, a dyed toluene solution through the sheet of paper to the back side. The penetration is expressed as a percentage of the total area covered by the dyed toluene on the front side, as opposed to microscopic holdout, and is governed to a greater extent by pinholes and the general formation of the raw stock.

Microscopic penetration of toluene refers to the attack of the solvent on the coated surface.

It was found, in accordance with the concepts of the present invention that the plastic particles can also be used to obtain resistance to solvents such as toluene. Specifically, it was found that a barrier coat, containing plastic particles at levels as low as 10%, based on total pigment, reduces macroscopic penetration from about 100% to nearly 0%. This is quite remarkable and results from microscopic attack of toluene on the plastic particles. Although the present invention is not limited to a specific theory as to the reason for obtaining improved results, it is surmised that the plastic particles initially swell, from the toluene attack, and thus prevent capillary movement of toluene through the coating and paper sheet on subsequent exposure to toluene (or other solvents).

In one example, a paper sheet was prepared employing the procedure of Example 1 and a formulation, the same as Example 1. No precoat was applied. The formulation contained, as filler, 80% clay and 20% plastic particles, 722 Plastic Pigment (Dow Chemical Company). The coating was applied to both sides, with a coat weight of about 9 pounds per 3300 sq. ft. per side. After coating, the paper was dried and was given a light calendering. The paper was tested for toluene holdout following the procedure set forth in TAPPI Provisional Method T 528 pm-74, captioned "Solvent Holdout of Electrophotographic Base Paper". This procedure is incorporated by reference herein. In essence, the procedure involves contacting a test specimen with a dye solution of the solvent and blotting the same at the end of about five seconds. The back side of the test area is immediately compared with a solvent holdout chart for amount of penetration. A comparative test was conducted using the same procedures and formulation except that the coating contained no plastic pigment. The coating was also tested for toluene holdout. In this example, the solvent penetration was reduced from about 70% in the sheet treated as above except no plastic particles were added to virtually 0 penetration when plastic particles were added.

Similar results were obtained with varying amounts of plastic pigment, different coat weights and different types of plastic pigments.

It has been further found, in accordance with the present invention, that the plastic particles need not be associated with a coating. Specifically, the plastic particles may be added at the wet-end of the paper machine. This may be done by addition of plastic particles at some point during manufacture, such as at the blender or the stuffbox.

In one example, Dow Plastic Pigment 722 was added to a pulp slurry containing a small quantity of Dow CP-7 retention aid. Approximately 40% plastic pigment based on dry pulp was added. The amount actually retained was 21.7% based on dry pulp. Handsheets were prepared, conditioned at 50% R.H. for 24 hours, and given a steel-to-steel calendering. A Cobb test of 110 gm/m² of water adsorption for 90 seconds was obtained. When the sheet was further treated with toluene, the Cobb test for 90 seconds was reduced to 9.2 gm/m². Thus, a large improvement in water resistance is obtainable when plastic particles are added prior to the formation of a paper web.

As a still further embodiment of the present invention, it is possible to employ particles which are sensitive to a solvent other than plastic particles. Such particles should have a melting point higher than that involved in any of the stages of paper making, for instance in the drying steps. Thus, preferably they have a melting point higher than about 100° C. Representatives of such particles include beeswax, montan wax, gilsonite, pitch, asphalt, synthetic waxes having a melting point above 100° C., vegetable tallow wax and waxy polyethylene with microcrystalline wax. Others will be apparent to those skilled in the art.

Throughout the above specification, reference has been made to the use of paper as the base for the electrostatic masters of the present invention. It should be understood that the term "paper" refers to the use of all types of webbed compositions regardless of whether or not cellulosic materials are present. Broadly, the present invention is applicable to all situations where water resistance of the base is desired. By way of example, cotton or synthetic fibers are quite commonly employed in the manufacture of lithographic masters.

What is claimed is:

1. An electrostatic master having improved water resistance for lighographic printing comprising a base;

a barrier coat; and a photoconductive layer containing a photoconductive material and a binder;

said barrier coat comprising a binding amount of a natural or synthetic binder and a filler at least a portion of which is an amount of plastic polymeric particles sensitive to the solvent used in the application of the photoconductive layer, said plastic polymeric particles being in an at least partially coalesced state in said barrier coat.

2. The master of claim 1 wherein said plastic polymeric particles comprise about 10 to 100% of the filler content.

3. The master of claim 2 wherein said plastic polymeric particles have an average particle size of about 0.01 to 20.0 microns.

4. The master of claim 3 wherein said binder is present in an amount of about 10 to 40% based on the total weight of filler.

5. The master of claim 4 wherein said plastic polymeric particles are a material which is water repellent and water insensitive.

6. The master of claim 5 wherein said plastic polymeric particles are a material selected from the group consisting of polystyrene, polyvinyl acetate and copolymers thereof, polyvinyl butyral and copolymers thereof, polyacrylates and copolymers thereof, and mixtures of any of the above.

7. A method for the preparation of electrostatic masters having improved water resistance for lithographic printing comprising the steps of;

(a) applying to a base a barrier coat comprising a binding amount of a natural or synthetic binder and a filler at least a portion of which is an amount of plastic polymeric particles;

(b) drying the formed barrier coat, said plastic polymeric particles being in a non-coalesced state at time of application and non-film forming under the conditions of application and drying of the coating; and (c) applying to said barrier coat a photoconductive coating comprising a photoconductive material in a binder and solvent, the plastic polymeric particles of the barrier coat being sensitive to said solvent;

(d) the amount of plastic polymeric particles and sensitivity to the solvent of the photoconductive layer being sufficient to materially increase water resistance.

8. The method of claim 7 wherein said plastic polymeric particles comprise about 10 to 100% of the filler content.

9. The method of claim 8 wherein said plastic polymeric particles have an average particle size of about 0.01 to 20.0 microns.

10. The method of claim 9 wherein said binder is present in an amount of about 10 to 40% based on the total weight of filler.

11. The method of claim 10 wherein said plastic polymeric particles are a material which is water repellent and water insensitive.

12. The method of claim 11 wherein said plastic polymeric particles are a material selected from the group consisting of polystyrene, polyvinyl acetate and copolymers thereof, polyvinyl butyral and copolymers thereof, and polyacrylates and copolymers thereof.

13. The method of claim 7 wherein said binder is styrene-butadiene having a low level of carboxylation.

14. The method of claim 7 wherein said solvent of the photoconductive layer is a compound selected from the group consisting of toluene, benzene, xylene, chlorinated aliphatic compounds and ketones.

15. The method of claim 7 wherein said barrier coat is applied in an amount sufficient to materially increase water resistance.

16. The method of claim 15 wherein said barrier coat is applied in an amount sufficient to achieve a 4 to 90-fold increase in water resistance as measured by the Cobb test.

17. A method for the preparation of electrostatic masters having improved water resistance for lithographic printing comprising the steps of;

(a) applying to a base a barrier coat comprising a binding amount of a natural or synthetic binder and a filler 10–100% of which are plastic polymeric particles of a material selected from the group consisting of polystyrene, polyvinyl acetate and copolymers thereof, polyvinyl butyral and copolymers thereof and polyacrylates and copolymers thereof, said plastic polymeric particles having an average particle size of about 0.01 to 20.0 microns, said binder being present in an amount of about 10 to 40% based on the total weight of filler;

(b) drying the formed barrier coat, said plastic polymeric particles being in a non-coalesced state at time of application and non-film forming under the conditions of application and drying of the coating; and (c) applying to said barrier coat a photoconductive coating comprising a photoconductive material in a binder and solvent, the plastic polymeric particles of the barrier coat being sufficiently sensitive to said solvent as to obtain a material increase in water resistance.

18. The method of claim 17 wherein said binder is styrene-butadiene having a low level of carboxylation.

19. A method for the preparation of electrostatic masters having improved water resistance for lithographic printing comprising the steps of;

(a) applying to a base a barrier coat comprising a binding amount of a natural or synthetic binder and a filler at least a portion of which is an amount of plastic polymeric particles;

(b) drying the formed barrier coat, said plastic polymeric particles being in a non-coalesced state at time of application and non-film forming under the conditions of application and drying of the coating;

(c) wetting the formed barrier coating with a solvent to which the plastic polymeric particles are sensitive, the amount of plastic polymeric particles and sensitivity to the solvent being sufficient to materially increase water resistance; and (d) then applying to said barrier coat a photoconductive coating comprising a photoconductive material in a binder.

20. The method of claim 19 which includes the step of drying the formed coating of step (a) prior to wetting with a solvent.

21. The method of claim 20 wherein the formed coating from step (a) is calendered prior to and/or after wetting with a solvent.

* * * * *